United States Patent
Okumura et al.

(10) Patent No.: US 7,649,369 B2
(45) Date of Patent: Jan. 19, 2010

(54) PROBE AND METHOD OF MANUFACTURING PROBE

(75) Inventors: Katsuya Okumura, Tokyo (JP); Toshihiro Yonezawa, Nirasaki (JP)

(73) Assignees: Octec Inc. (JP); TOKYO Electron Limited (JP)

( * ) Notice: Subject to any disclaimer, the term of this patent is extended or adjusted under 35 U.S.C. 154(b) by 106 days.

(21) Appl. No.: 10/591,645

(22) PCT Filed: Mar. 3, 2005

(86) PCT No.: PCT/JP2005/003609

§ 371 (c)(1),
(2), (4) Date: Sep. 5, 2006

(87) PCT Pub. No.: WO2005/085877

PCT Pub. Date: Sep. 15, 2005

(65) Prior Publication Data

US 2008/0036479 A1    Feb. 14, 2008

(30) Foreign Application Priority Data

Mar. 5, 2004    (JP)    ............................ 2004-063228

(51) Int. Cl.
*G01R 31/02*    (2006.01)
*G01R 31/28*    (2006.01)

(52) U.S. Cl. .................... 324/756; 324/158.1
(58) Field of Classification Search ............. 324/158.1, 324/754–763; 438/14–18
See application file for complete search history.

(56) References Cited

U.S. PATENT DOCUMENTS

| | | | | |
|---|---|---|---|---|
| 5,419,807 A | * | 5/1995 | Akram et al. | 324/724 |
| 5,483,741 A | * | 1/1996 | Akram et al. | 29/846 |
| 5,606,263 A | * | 2/1997 | Yoshizawa et al. | 324/761 |
| 5,763,879 A | * | 6/1998 | Zimmer et al. | 250/306 |
| 6,197,603 B1 | * | 3/2001 | Kohno et al. | 438/14 |

(Continued)

FOREIGN PATENT DOCUMENTS

DE    103 23 224 A1    12/2003

(Continued)

*Primary Examiner*—Ha Tran T Nguyen
*Assistant Examiner*—Joshua Benitez
(74) *Attorney, Agent, or Firm*—Finnegan, Henderson, Farabow, Garrett & Dunner, L.L.P.

(57) ABSTRACT

In accordance with an increase in speed, a wiring structure has rapidly become more microscopic and thinner and a wiring layer has become extremely thin, and therefore, giving a contact load to a probe for the inspection as has been conventionally done causes damage to a wiring layer and an insulation layer because the probe penetrates not only the oxide film but also the wiring layer or because of a concentration stress from the probe. On the other hand, decreasing the contact load causes unstable continuity between the probe and an electrode pad.

It is an object of the present invention to surely and stably inspect an object to be inspected by breaking an oxide film with a low stylus pressure.

The present invention is a probe that comes into electrical contact with an object to be inspected when inspecting an electrical characteristic of the object to be inspected, the probe including: a probe main body having a contact portion that comes into contact with the object to be inspected; and a plurality of conductive materials having tip portions projecting from the contact portion of the probe main body.

2 Claims, 3 Drawing Sheets

U.S. PATENT DOCUMENTS

| | | | |
|---|---|---|---|
| 6,285,201 B1 * | 9/2001 | Farnworth et al. | 324/755 |
| 6,352,454 B1 * | 3/2002 | Kim et al. | 439/886 |
| 6,356,098 B1 * | 3/2002 | Akram et al. | 324/765 |
| 6,469,537 B1 * | 10/2002 | Akram et al. | 324/765 |
| 6,812,723 B2 * | 11/2004 | Mikami | 324/761 |
| 6,888,344 B2 * | 5/2005 | Maekawa et al. | 324/158.1 |
| 7,015,707 B2 * | 3/2006 | Cherian | 324/754 |
| 7,112,974 B1 * | 9/2006 | Jin et al. | 324/754 |
| 7,119,557 B2 * | 10/2006 | Lee | 324/754 |
| 7,285,430 B2 * | 10/2007 | Kasukabe et al. | 438/17 |
| 2003/0218252 A1 | 11/2003 | Suzuki et al. | |

FOREIGN PATENT DOCUMENTS

| | | |
|---|---|---|
| JP | 08-306749 | 11/1996 |
| JP | 10-115637 | 5/1998 |
| JP | 10-132854 | 5/1998 |
| JP | 10-221370 | 8/1998 |
| JP | 11-051970 | 2/1999 |
| JP | 2000-294043 A | 10/2000 |
| JP | 2004-056078 | 2/2004 |

* cited by examiner

PROBE AND METHOD OF MANUFACTURING PROBE

CROSS REFERENCE TO RELATED APPLICATIONS

This application is a National Phase Application of International Application No. PCT/JP2005/003609, filed Mar. 3, 2005, and claims the priority of Japanese Patent Application No. 2004-063228, filed Mar. 5, 2004, the content of both of which is incorporated herein by reference.

TECHNICAL FIELD

The present invention relates to a probe used for inspecting an electrical characteristic of an object to be inspected such as a wafer, and more particularly, to a probe enabling inspection with a less stylus pressure.

BACKGROUND ART

For inspecting an electrical characteristic of an object to be inspected such as a wafer, an inspection device such as, for example, a probe device is used. The inspection device is provided with a probe card coming into electrical contact with the object to be inspected, and inspects electrical characteristics of IC chips formed on the object to be inspected by bringing a plurality of probes attached to the probe card into electrical contact with electrode pads of the IC chips.

However, since the electrode pads are formed of conductive metal such as, for example, aluminum, and oxide films formed on surfaces of the electrode pads serve as insulators, it is not possible to establish electrical continuity only by bringing the probes into contact with the electrode pads. Therefore, the electrical continuity between the probes and the electrode pads is established in such a manner that the probes scribe surfaces of the electrode pads to shave off the oxide films while given a predetermined contact load (stylus pressure), or the oxide films are pierced through by tips of the probes.

For example, a patent document 1 proposes a probe to pierce through an oxide film of an electrode pad. This probe has at tip portions thereof a plurality of projections, and owing to these projections, the probe has an increased contact area that comes into contact with the electrode pad, and the projections pierce through the oxide film, so that the probe comes into electrical contact with the electrode pad. As the projection, proposed are a lattice-formed projection with a tip thereof having an acute-angled triangular cross section, a spindle-shaped projection with a tip thereof having an acute-angled triangular cross section, and the like.

Further, a patent document 2 proposes a method of manufacturing a probe card in which irregularities are formed on a tip surface of a bump connected as an inspection electrode of a semiconductor chip. Moreover, a patent document 3 also proposes a contactor of the same type as that in the patent document 2 and a method of forming the contactor. The bumps proposed in these patent documents are also arts in which the irregularities on the tip surface of the bump break an oxide film of an electrode pad, as in the patent document 1.

[Patent document 1] Japanese Patent Application Laid-open No. Hei 11-051970

[Patent document 2] Japanese Patent Application Laid-open No. Hei 08-306749

[Patent document 3] Japanese Patent Application Laid-open No. Hei 10-132854

DISCLOSURE OF THE INVENTION

Problems to Be Solved by the Invention

However, in recent years, in accordance with sophistication of functions and speed increase of an integrated circuit, a wiring structure has rapidly become more microscopic and thinner and a wiring layer has become extremely thin, and therefore, giving a stylus pressure to the probe for the inspection as described in the conventional patent document 1 involves a risk of damaging a wiring layer and an insulation layer because the probe penetrates not only the oxide film but also the wiring layer or because of a concentration stress from the probe. On the contrary, decreasing the stylus pressure involves a risk of causing unstable continuity between the probe and the electrode pad. Further, though the bumps described in the patent documents 2, 3 can surely break the oxide film of an electrode pad by the irregularities, it involves a risk of damaging the wiring layer and the insulation layer depending on the stylus pressure, similarly to the case of the patent document 1.

The present invention was made to solve the aforesaid problems and an object thereof is to provide a probe and a method of manufacturing the same enabling sure and stable inspection of an object to be inspected by breaking an oxide film with a low stylus pressure.

Means for Solving the Problems

The present invention is a probe that comes into electrical contact with an object to be inspected when inspecting an electrical characteristic of the object to be inspected, the probe including: a probe main body having a contact portion that comes into contact with the object to be inspected; and a plurality of conductive materials each having a tip portion projecting from the contact portion of the probe main body, wherein the contact portion has a contact surface that comes into contact with the object to be inspected, the tip portions are formed to project from the contact surface, a projection length of the tip portions being larger than a thickness of an oxide film formed on a surface of an electrode of the object to be inspected, and the contact surface comes into contact with the surface of the electrode of the object to be inspected to function as a stopper for the tip portions when the tip portions penetrate the oxide film to reach the electrode.

The conductive materials may be buried in the contact portion and made of a material harder than the contact portion.

The conductive materials may be made of conductive diamond or nanoscale metal.

The present invention according to another aspect is a method of manufacturing a probe that comes into electrical contact with an object to be inspected when inspecting an electrical characteristic of the object to be inspected, the method including the steps of: forming, on a substrate, a mold of a contact portion that comes into contact with the object to be inspected; putting in the mold a plurality of conductive materials having tip portions; forming the contact portion by filling conductive metal in the mold; forming a probe main body including the contact portion; and releasing the contact portion from the mold and making the tip portions of the conductive materials project from the contact portion.

Effect of the Invention

According to the present invention, it is possible to provide a probe enabling sure and stable inspection of an object to be inspected with a low stylus pressure by breaking an oxide film, and a method of manufacturing the same.

EXPLANATION OF CODES 10 probe
11 probe main body
11A contact portion
11B contact surface
12 conductive particle
12A pointed portion

BEST MODE FOR CARRYING OUT THE INVENTION

Figure 1A:
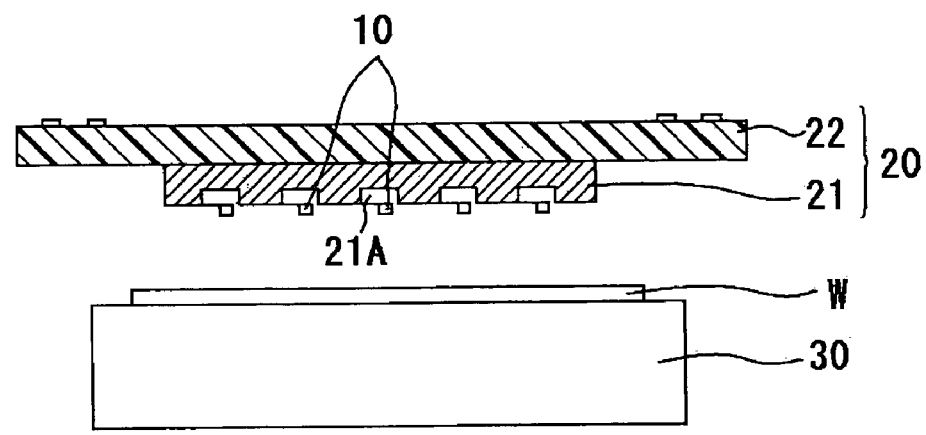
[FIG. 1]
(a) and (b) are views showing one embodiment of a probe of the present invention, (a) being a cross-sectional view showing a probe card to which the probe is applied, and (b) being a cross-sectional view showing an essential part of the probe.
Figure 1B:
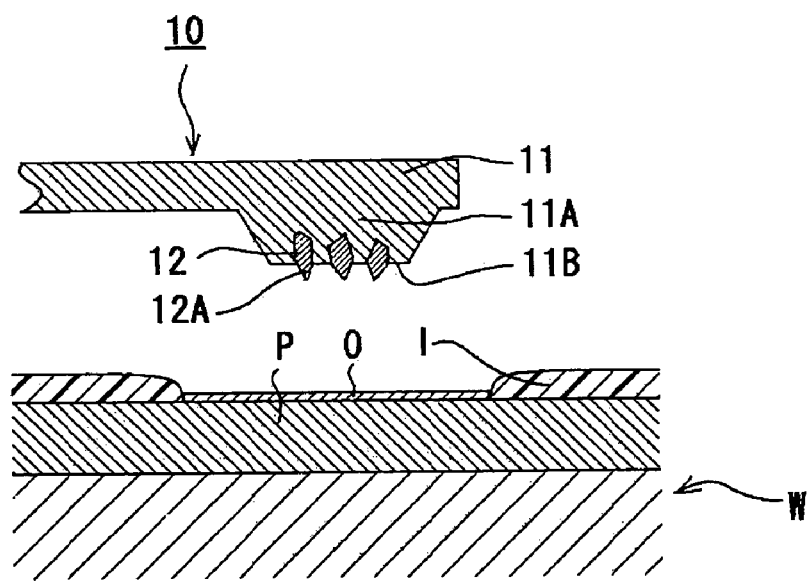
Figure 2:
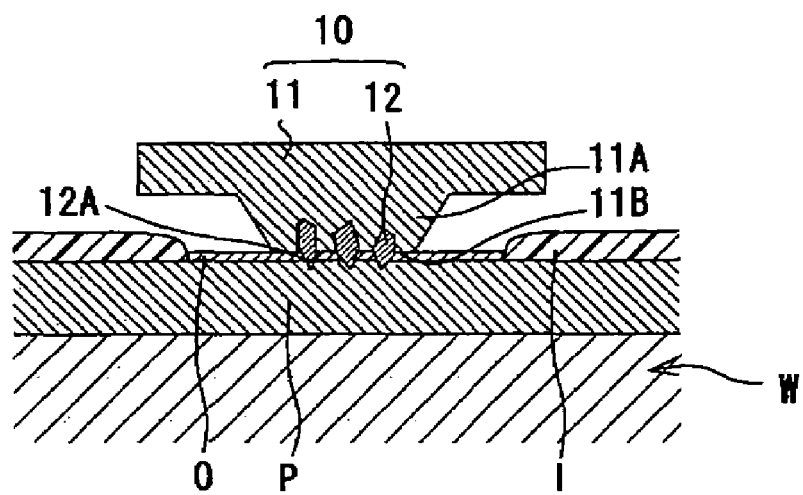
[FIG. 2]
A cross-sectional view showing a state in which the probe and an electrode pad shown in FIG. 1 are in electrical contact with each other.

Hereinafter, the present invention will be described based on embodiments shown in FIG. 1 to FIG. 3. FIGS. 1(a) and (b) are views showing an embodiment of the probe of the present invention, (a) being a cross-sectional view showing a probe card to which the probe is applied and (b) being a cross-sectional view showing an essential part of the probe, FIG. 2 is a cross-sectional view showing a state in which the probe and an electrode pad shown in FIG. 1 are in electrical contact with each other, and FIGS. 3(a) to (e) are cross-sectional views showing essential parts of manufacturing steps of the probe shown in FIG. 1.

When in use, probes 10 of this embodiment are attached to a probe card 20 as shown in, for example, FIG. 1(a). As shown in the drawing, the probe card 20 includes a contactor 21 formed of, for example, a ceramic substrate, and a printed wiring board 22 electrically connected to the contactor 21, and is structured to inspect electrical characteristics of a plurality of IC chips (not shown) formed on a wafer W in such a manner that, for example, the probe card 10 is set to face an object to be inspected placed on a mounting table 30 disposed in a probe device main body, and the mounting table 30 moves horizontally and vertically, thereby causing the probes 10 of the probe card 20 to come into contact with part of the IC chips or into contact collectively with all the IC chips.

As shown in FIG. 1(a), on a bottom surface of the contactor 21, a plurality of recessed portions 21A corresponding to electrode pads P of an integrated circuit are formed in a predetermined pattern, and the probes 10 of this embodiment are attached to the bottom surface of the contactor 21 in correspondence to the recessed portions 21A. Wring layers are formed in the contactor 21 through a plurality of layers, and the probes 10 and the printed wiring board 22 are electrically connected via the wiring layers.

As shown in, for example, FIGS. 1(a) and (b), the probe 10 includes: a probe main body 11 formed in a slender shape; a contact portion 11A that comes into contact with the object to be inspected and that is formed in a tip portion of the probe main body 11; and a plurality of conductive materials (conductive particles) 12 each having a tip portion 12A projecting from the contact portion 11A, and the contact portion 11A elastically enters and leaves the recessed portion 21A of the contactor 21 via the probe main body 11. The tip portions 12A of the conductive particles 12 are formed as pointed portions with tips thereof sharp-pointed as shown in FIG. 1(b). Therefore, in the description below, the tip portions 12A are referred to as the pointed portions 12A.

The probe main body 11 is made of conductive metal having toughness and elasticity such as nickel. Further, the contact portion 11A is made of the same conductive material as that of the probe main body 11 in this embodiment, but may be made of other conductive metal. The conductive particles 12 are made of a material harder than the contact portion 11A or a material superior in chemical resistance, for example, conductive diamond, carbon nanotube, or nanoscale metal, and are buried in the contact portion 11A. Further, the electrode pads P of the IC chips on the wafer W are made of conductive metal such as, for example, aluminum or copper. Incidentally, in FIG. 1(b), I denotes a protective film.

As shown in FIG. 1(b), the contact portion 11A has a contact surface 11B that is formed substantially parallel to an upper surface of the electrode pad P and comes into contact with the electrode pad P, as will be described later. The pointed portions 12A of the plural conductive particles 12 project from the contact surface 11B of the contact portion 11A by a predetermined length, and at the time of the inspection, the pointed portions 12A pierce through an oxide film O formed on the electrode pad P to come into electrical contact with the electrode pad, thereby establishing electrical continuity between the probe 10 and the IC chip. Further, when the pointed portions 12A of the conductive particles 12 of the probe 10 stick in the electrode pad P, the contact surface 11B comes into contact with the electrode pad P to function as a stopper, thereby preventing the pointed portions 12A from sticking in the electrode pad P up to a depth exceeding a predetermined depth.

In this embodiment, the contact surface 11B of the probe main body 11 is formed in, for example, a substantially circular shape and has an about 30 μm diameter, and the pointed portions 12A of the conductive particles 12 project from the contact surface 11B by about 0.3 μm. As for the electrode pad P, for example, an aluminum metal layer with about 1 μm thickness is formed therein and on a surface thereof, the oxide film with about 0.1 m thickness is formed.

When an electrical characteristic of the wafer W is inspected by using the probe 10 of this embodiment, the wafer W is placed on the mounting table 30 as shown in FIG. 1(a), the mounting table 30 moves horizontally to reach right under an inspection position of the wafer W as shown in FIG. 1(b). Next, when the mounting table 30 moves up, the pointed portions 12A of the conductive particles 12 of the probe 10 come into contact with the electrode pad P in the wafer W, and thereafter, the mounting table 30 is overdriven to apply a stylus pressure of, for example, 1 gf/piece between the probe 10 and the electrode pad P.

Due to the overdrive of the mounting table 30, the pointed portions 12A of the conductive particles 12 projecting from the contact portion 11A of the probe 10 pierce through the oxide film O formed on the electrode pad P to enter the inside of the electrode pad P, as shown in FIG. 2, so that the probe 10 and the electrode pad P are electrically connected. When the pointed portions 12A of the conductive particles 12 reach the predetermined depth in the electrode pad P, the contact portion 11A comes into surface contact with the electrode pad P via the contact surface 11B, so that the contact portion 11A does not further enter the inside of the electrode pad P. Therefore, since the electrode pad P becomes thinner and the contact surface 11B of the contact portion 11A functions as a stopper, it is possible to surely and stably inspect the electric characteristic of the IC chip without damaging the electrode pad P by the probe 10.

Further, the probe 10 of this embodiment can be fabricated by, for example, a microfabrication technology such as an ES (microelectronic mechanical system) process that uses a photolithography technique. A method of manufacturing the probe of the present invention will now be roughly described with reference to FIGS. 3(a) to (e). In the manufacturing method of the present invention, the conventionally known microfabrication technology is usable except when the conductive particles 12 are buried in the contact portion 11A of the probe 10.

Figure 3A:
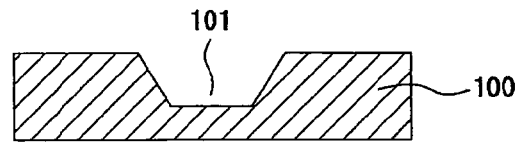
[FIG. 3]
(a) to (e) are cross-sectional views showing essential parts of manufacturing steps of the probe shown in FIG. 1.

For manufacturing the probe, first, a resist is applied on a surface of a silicon substrate to form a resist film, and after being exposed via a photomask, the resist film is developed to have openings in places where molds of the contact portions 11A of the probe main bodies 11 are to be formed. Thereafter, as shown in FIG. 3(a), by using the resist film as a mask, the silicon substrate 100 is etched, whereby molds 101 for forming the contact portions 11A are formed, and thereafter, the resist film is removed. At this time, the molds 101 are formed in a plurality of places of the silicon substrate 100 according to an arrangement pattern of the probes 10 of the contactor 21.

Figure 3B:
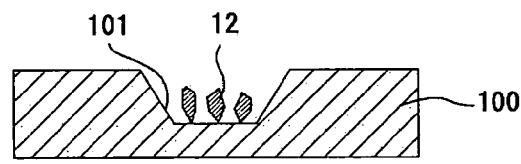
Figure 3C:
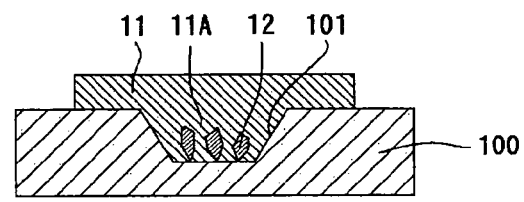

Next, after a metal thin film is formed by sputtering the surface of the silicon substrate, the plural conductive particles 12 are put into each of the molds 101 on the silicon substrate 100 as shown in FIG. 3(b). In this state, as shown in FIG. 3(c), the silicon substrate 100 is plated and metal such as nickel is filled in the mold 101, whereby the contact portion 11A of the probe main body 11 is formed. At this time, as shown in this drawing, the probe main body 11 and the contact portion 11A can be formed together. Alternatively, when necessary, after the contact portion 11A is formed, the probe main body 11 may be formed by using the same material as or a different material from that of the contact portion 11A.

Figure 3D:
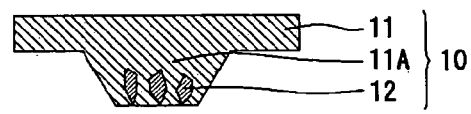
Figure 3E:
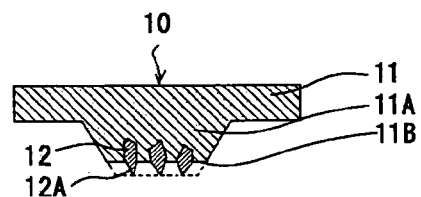

Thereafter, as shown in FIG. 3(d), the probe main body 11 and the contact portion 11A are released from the silicon substrate 100 as a probe. In this state, the conductive particles 12 are left buried in the contact portion 11A, and therefore, as shown in FIG. 3(e), the contact portion 11A is immersed in an etching solution, whereby a lower end portion of the contact portion 11A is removed, so that the pointed portions 12A of the conductive particles 12 project and the contact surface is formed. A projection length of the pointed portions 12A is set to a depth large enough to break the oxide film of the electrode pad (for example, about 0.3 μm). After the pointed portions 12A are formed in the contact portion 11A, the probes are transferred to predetermined places of a ceramic substrate, whereby the contactor 21 is completed. In order to make the pointed portions 12A of the conductive particles 12 project from the contact portion 11A, a lower portion of the contact portion 11A may be shaved off.

As has been described hitherto, the probe 10 of this embodiment has: a probe main body 11; and the plural conductive particles 12 having the pointed portions 12A projecting from the contact portion 11A of the probe main body 11, and therefore, if a predetermined stylus pressure is applied to the probe 10, the pointed portions 12A of the plural conductive particles 12 pierce through the oxide film O on the electrode pad P at a plurality of places, so that the probe 10 and the electrode pad P are surely electrically connected, which enables sure and stable inspection of the IC chip on the wafer W. At this time, since the contact surface 11B is formed on the contact portion 11A, the contact surface 11B functions as a stopper to prevent the pointed portions 12A of the conductive particles 12 from damaging the electrode pad P. Moreover, since the conductive particles 12 are made of the conductive diamond that is harder than the probe main body II and the electrode pad P, it is possible to reduce the abrasion of the probe 10.

Further, in manufacturing the probe 10, since a material that is harder than the contact portion 11A or a material superior in chemical resistance is used to form the conductive particles 12, it is possible to melt only the lower end portion of the contact portion 11A by using the etching solution, so that the pointed portions 12A of the conductive particles 12 can be easily made to project from the contact portion 11A. Alternatively, instead of using the etching solution, it is also possible to shave off only the lower portion of the contact portion 11A, so that the pointed portions 12A of the conductive particles 12 can be easily made to project from the contact portion 11A.

It should be noted that the present invention is not limited to the above-described embodiments. For example, the above embodiments have described the probe of a cantilever type, but the probe of the present invention may be a probe in any form such as a vertical probe or an elastic type probe that is bent in zigzag. Further, in a case where carbon nanotube is used as the conductive materials, carbon nanotube is grown on the contact portion of the probe and thereafter the carbon nanotube is made to project by removing part of the contact portion. The point is that any probe is included in the present invention providing that it is a probe in which a probe main body has conductive materials in a contact portion that comes into contact with an object to be inspected and tip portions of the conductive materials project from the contact portion.

INDUSTRIAL APPLICABILITY

The present invention can be suitably utilized as a probe of, for example, an inspection device.

What is claimed is:

1. A probe that comes into electrical contact with an object to be inspected when inspecting an electrical characteristic of the object to be inspected, the probe comprising:
    a probe main body having a contact portion that comes into contact with the object to be inspected; and
    a plurality of conductive materials each having a tip portion projecting from the contact portion of said probe main body,
    wherein the conductive materials are buried in the contact portion and made of a material harder than the contact portion, and
    wherein the contact portion has a contact surface that comes into contact with the object to be inspected, the tip portions are formed to project from the contact surface, a projection length of the tip portions being larger than a thickness of an oxide film formed on a surface of an electrode of the object to be inspected, and the contact surface is formed substantially parallel to the surface of the electrode and comes into contact with the oxide film on the surface of the electrode to function as a stopper for the tip portions when the tip portions penetrate the oxide film to reach the electrode.

2. The probe according to claim 1, wherein said conductive materials are made of conductive diamond or nanoscale metal.

* * * * *